United States Patent
Zimmer et al.

(10) Patent No.: US 12,087,873 B2
(45) Date of Patent: Sep. 10, 2024

(54) SPAD PHOTODIODE

(71) Applicant: STMicroelectronics (Crolles 2) SAS, Crolles (FR)

(72) Inventors: Antonin Zimmer, Meylan (FR); Dominique Golanski, Gieres (FR); Raul Andres Bianchi, Myans (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 293 days.

(21) Appl. No.: 17/702,186

(22) Filed: Mar. 23, 2022

(65) Prior Publication Data

US 2022/0310867 A1    Sep. 29, 2022

(30) Foreign Application Priority Data

Mar. 25, 2021  (FR) ...................................... 2103040

(51) Int. Cl.
*H01L 31/107*  (2006.01)

(52) U.S. Cl.
CPC .................................. *H01L 31/107* (2013.01)

(58) Field of Classification Search
CPC ..................................................... H01L 31/107
See application file for complete search history.

(56) References Cited

U.S. PATENT DOCUMENTS

| | | | |
|---|---|---|---|
| 2007/0012948 A1* | 1/2007 | Dries | ............... H01L 31/02327 257/438 |
| 2010/0103299 A1 | 4/2010 | Miyata | |
| 2010/0117183 A1 | 5/2010 | Rothman et al. | |

FOREIGN PATENT DOCUMENTS

| | | | | |
|---|---|---|---|---|
| EP | 1679749 A1 * | 1/2007 | .......... | H01L 27/146 |
| FR | 2475296 A1 | 8/1981 | | |
| JP | 09232621 A | 9/1997 | | |

OTHER PUBLICATIONS

Chapard et al., FR-2475296-A1, 1981.*
INPI Search Report and Written Opinion for priority application, FR Appl. No. 2103040, report dated Feb. 4, 2022, 9 pgs.
Morimoto, K., et al: "Charge-Focusing SPAD Image Sensors for Low Light Imaging Applications," conference presentation, Jun. 2020, ISSW 2020, 36 pgs.

* cited by examiner

*Primary Examiner* — Suberr L Chi
(74) *Attorney, Agent, or Firm* — Crowe & Dunlevy LLC

(57) ABSTRACT

A photodiode is formed in a semiconductor substrate of a first conductivity type. The photodiode includes a first region having a substantially hemispherical shape and a substantially hemispherical core of a second conductivity type, different from the first conductivity type, within the first region. An epitaxial layer covers the semiconductor substrate and buries the first region and core.

20 Claims, 4 Drawing Sheets

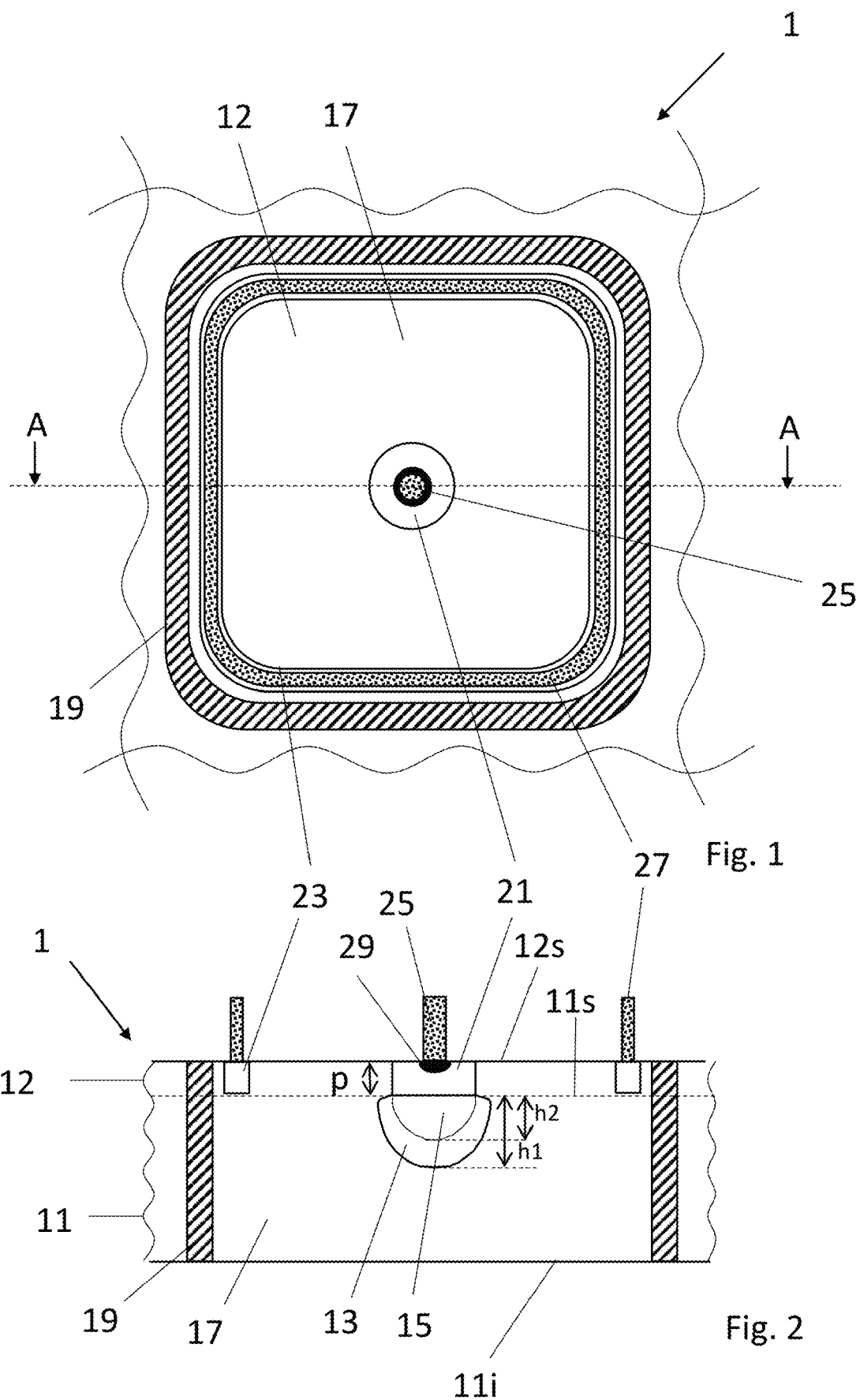

SPAD PHOTODIODE

PRIORITY CLAIM

This application claims the priority benefit of French Application for Patent No. 2103040, filed on Mar. 25, 2021, the content of which is hereby incorporated by reference in its entirety to the maximum extent allowable by law.

TECHNICAL FIELD

The present disclosure relates generally to photodiodes and, more particularly, to single photon avalanche diodes (SPAD) and their manufacturing method.

BACKGROUND

A photodiode is a semiconductor device with the ability to capture radiation from the optical domain and transform it into an electrical signal. A SPAD photodiode is a photodiode consisting of a PN junction reverse biased to a voltage above its avalanche voltage. Under these conditions, a single carrier photogenerated in the depletion region can trigger an avalanche created by impact ionization effects. The resulting current flows until the avalanche is quenched. A SPAD photodiode can detect very low light intensity radiation and is used in particular for single photon detection and photon counting.

A SPAD photodiode generally comprises, in addition to the PN junction, a guard ring surrounding the PN junction. In particular, the guard ring prevents premature triggering of the photodiode at the periphery of the junction. It also reduces the probability for minority carriers coming from the periphery of the junction.

The size of the guard ring, in the plane of the upper surface of the photodiode, determines the fill factor (FF) of the photodiode.

The increasing miniaturization of electronic devices is creating a need for smaller photodiodes.

There is a need for improved SPAD photodiodes and their manufacturing method.

SUMMARY

One embodiment addresses all or some of the drawbacks of known SPAD photodiodes.

One embodiment provides a photodiode having, in a semiconductor substrate of a first conductivity type: a first substantially hemispherical buried region of the first conductivity type; and within the first region, a substantially hemispherical core of a second conductivity type, different from the first conductivity type.

One embodiment provides a method of manufacturing a photodiode, comprising forming, in a semiconductor substrate of a first conductivity type: a first substantially hemispherical buried region of the first conductivity type; and within the first region, a substantially hemispherical core of a second conductivity type, different from the first conductivity type.

According to one embodiment, the core and the first region are formed in a well delimited by a peripheral insulating trench.

According to one embodiment, the first region and the core are made from a first face of the substrate.

According to one embodiment, the core and the first region are, in a plane parallel to the first face of the substrate, located in the center of the well.

According to one embodiment, all or part of the first region is formed by an oblique implantation of dopants of the first conductivity type, with respect to the normal to the first face of the substrate, by an angle greater than 20°, preferably between 25° and 45°.

According to one embodiment, the first region is formed by a succession of several oblique implantations of dopants at different angles of rotation of the substrate, the structure being in rotation about an axis orthogonal to the first face and passing through the center of the substrate.

According to one embodiment, the substrate is doped gradually in an increasing manner from its first face to a second face of the substrate, on the opposite side to the first face.

According to one embodiment, the core has a diameter, in a plane parallel to the first face of the substrate, between 400 nm and 800 nm, preferably of the order of 600 nm.

According to one embodiment, the first face of the substrate is topped with an epitaxial layer.

According to one embodiment, the epitaxial layer has a thickness of about 500 nm.

According to one embodiment, the epitaxial layer forms a face parallel to the first face of the substrate.

According to one embodiment, the photodiode or method comprises, in alignment with the core, on and in contact with the core, a second region of the second conductivity type, flush with the face of the epitaxial layer.

According to one embodiment, the method comprises the photodiode or the method comprises a third annular region of contact recovery, between the second region and the insulating trench, the third region being located closer to the insulating trench than to the second region, the third region being of the first conductivity type and the third region being flush with the face of the epitaxial layer.

According to one embodiment, a first electrode, preferably a cathode, is formed on and in contact with the second region and a second electrode, preferably an anode, is formed on and in contact with the third region.

According to one embodiment, the core has a maximum height of about 500 nm.

According to one embodiment, the first region has a maximum height of about 1 μm.

According to one embodiment, the first region and the core are formed using a single mask.

According to one embodiment, the method comprises the following successive steps: forming in the semiconductor substrate of the first conductivity type, the first region of the first conductivity type by an oblique implantation; forming, in the first region, the substantially hemispherical core of the second conductivity type, different from the first conductivity type; and epitaxially growing from the substrate to bury the first region and form an epitaxial layer.

According to one embodiment, the method comprises the following successive steps: forming in the semiconductor substrate of the first conductivity type, the substantially hemispherical core of the second conductivity type, different from the first conductivity type; forming, under the core, the first region of the first conductivity type by an oblique implantation; and epitaxially growing from the substrate to bury the first region and form an epitaxial layer.

BRIEF DESCRIPTION OF THE DRAWINGS

The foregoing features and advantages, as well as others, will be described in detail in the following description of specific embodiments given by way of illustration and not limitation with reference to the accompanying drawings, in which:

FIG. 1 is a schematic partial top view of one embodiment of a photodiode.

FIG. 2 is a partial schematic cross-sectional view in plane AA of FIG. 1.

DETAILED DESCRIPTION

Figure 3:
FIG. 3 represents a cross-sectional view of a manufacturing step of the photodiode of FIGS. 1 and 2.

Like features have been designated by like references in the various figures. In particular, the structural and/or functional features that are common among the various embodiments may have the same references and may dispose identical structural, dimensional, and material properties.

For the sake of clarity, only the operations and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

With a view to miniaturizing a single photon avalanche diode (SPAD) type photodiode, one might think of reducing in the same ratio (proportionally) the dimensions of its various constituents, particularly in the plane of the circuit integrating this photodiode. However, the width of the guard ring between the active area and the periphery of the photodiode has a critical size in order to maintain its role.

Furthermore, the smaller the surface area of the active region in the plane, the lower the fill factor. However, a high fill factor is generally sought for a question of efficiency of the active region.

According to the present disclosure, a PN junction of a photodiode in a substrate is provided in the form of a first hemispherical region and a core that is also hemispherical, the first hemispherical region of a first conductivity type including the hemispherical core of a second conductivity type. This allows, among other things, maximizing the size of the active region while miniaturizing the photodiode.

More particularly, it is contemplated that the first hemispherical region is formed by oblique implantation of dopants from the surface of the substrate, then the hemispherical core is formed by normal implantation of dopants from the surface of the substrate, and finally the PN junction is buried by a layer formed by epitaxy of the substrate in which the PN junction is formed.

FIGS. 1 and 2 are schematic partial top and cross-sectional views, respectively, of one embodiment of a photodiode 1. More particularly, FIG. 2 illustrates a cross-sectional view of the photodiode 1 according to the cross-sectional plane AA of FIG. 1.

According to one preferred embodiment, the photodiode 1 is a SPAD-type photodiode.

The photodiode 1 illustrated in FIGS. 1 and 2 includes, in a semiconductor substrate 11 of a first conductivity type, for example of the P-type: a buried first region 13 of the first conductivity type; and within the buried first region 13, a core 15 of a second conductivity type, for example of the N type, different from the first conductivity type.

The buried first region 13 and the core 15 form a PN junction.

The substrate 11 includes, for example, a face 11s, upper in the orientation of FIG. 2, and a face 11i, at the opposite side to the face 11s, lower in the orientation of FIG. 2.

The substrate 11 is, for example, topped or covered with an epitaxial layer 12. The epitaxial layer 12 comprises a lower face located on and in contact with the upper face 11s of the substrate 11 and an upper layer 12s at the opposite side to its lower face and parallel thereto.

The buried first region 13 and the core 15 each have substantially hemispherical shapes. By "substantially hemispherical" shape it is defined to mean that it has at least one rounded non-planar outer face, i.e., is shaped as a portion of the contour of a sphere, ellipsoid, geode or other spherical shape.

The core 15 has a substantially solid hemispherical shape defined by the non-planar face and a planar face. In other words, the core 15 has the shape of a portion of a solid sphere, a portion of a solid ellipsoid, a portion of a solid geode or a portion of any other solid spherical shape. The planar face corresponds to the upper face or base of the core 15 and is coplanar with the face 11s. The base of the core 15 is, for example, shaped like a disk or ellipsoidal disk.

The buried first region 13 integrates the core 15 and has a substantially hollow hemispherical shape, i.e., it has the shape of a portion of a hollow sphere, a portion of a hollow ellipsoid, a portion of a hollow geode or a portion of any other hollow spherical shape. The buried first region 13 has a circular, elliptical (void) or annular base coplanar with the substrate face 11s. The circle of the base of the buried first region 13 or the inner perimeter of its ring corresponds to the outer periphery of the base of the core 15.

The base of the core 15 preferably has a diameter between 400 nm and 800 nm, preferably in the range of 600 nm.

According to one embodiment, the respective bases of the buried first region 13 and the core 15 are flush with the surface 11s of the substrate 11. The core 15 and the buried first region 13 are thus buried at a depth p corresponding to the thickness of the epitaxial layer 12 with respect to the face 12s of the photodiode 1. This depth p is, for example, between 200 nm and 800 nm, preferably around 500 nm.

The buried first region 13 has, for example, a maximum height h1 between 500 nm and 1.5 μm, preferably of the order of 1 μm. The core 15 has, for example, a maximum height h2 between 200 nm and 800 nm, preferably of the order of 500 nm. By maximum height of the buried first region 13, of the core 15, is meant the distance between its base and its bottom, the bottom corresponding to the part of the buried first region 13, of the core 15, closest to the face 11i.

The buried first region 13 has, for example, a thickness equivalent to the difference between the heights h1 and h2. If applicable, according to the manufacturing technique used, the thickness of the buried first region 13 decreases between its maximum, perpendicular to the center of its base and a minimum at the edges of the base.

According to one embodiment, the buried first region 13 is lightly doped (i.e., comprises a concentration of dopant atoms approximately less than $10^{18}$ atoms/cm$^3$) and the core is heavily doped (i.e., comprises a concentration of dopant atoms approximately greater than $10^{19}$ atoms/cm$^3$).

The substrate 11 has, for example, a thickness between 1 μm and 10 μm, preferably on the order of 4.5 μm. The epitaxial layer 12 has, for example, a thickness between 100 nm and 800 nm, preferably of the order of 500 nm.

The substrate 11 is preferably doped gradually, increasing from the upper face 11s to the lower face at the opposite side 11i. In other words, the concentration of dopants in the substrate 11 is not homogeneous, with the concentration of dopants in the substrate 11 in the vicinity of the face 11i being higher than the concentration of dopants in the substrate 11 in the vicinity of the face 11s. For example, the concentration of dopant atoms in the substrate 11 in the vicinity of the face 11i is of the order of $10^{18}$ atoms/cm$^3$ and the concentration of dopant atoms in the substrate 11 in the vicinity of the face 11s is of the order of $10^{14}$ atoms/cm$^3$. This facilitates the displacement of photons, which have arrived outside the depletion region, i.e. far from the PN junction, in the vicinity of this depletion region.

The buried first region 13 and the core 15 are, for example, located in a well 17 extending into the substrate 11 and the epitaxial layer 12 and delimited by a Deep Trench Isolation (DTI) 19. The trench 19 surrounds the well 17. The trench 19 has, for example, the shape of a round or oval ring, the shape of a square frame or a frame with rounded corners (referred to in the art as a squircle) when viewed from above (see, FIG. 1). Alternatively, the trench 19 has any closed shape. The trench 19 extends, according to the embodiment illustrated in FIGS. 1 and 2, through the entire thickness of the substrate 11 and the epitaxial layer 12.

The buried first region 13 and the core 15 are preferably in a plane parallel to the face 11s, located at the center of the face 11s delimited by the trench 19.

According to the embodiment illustrated in FIGS. 1 and 2, the photodiode 1 comprises a second region 21. The second region 21 is preferably of the second conductivity type, for example of the N type. The second region 21 is preferably located in the epitaxial layer 12, on and in contact with the core 15. The second region 21 has, for example, the shape of a cylinder, one base of which is coplanar with the face 12s and the other base of which is coplanar with the face 11s. The bases of the cylinder correspond, for example, to the two plane and parallel faces of the cylinder. The base of the second region 21, coplanar with the face 12s, is preferably coplanar with the base of the core 15. Both bases of the second region 21 preferably have a diameter equal or substantially equal to the diameter of the base of the core 15.

The second region 21 preferably extends from the face 12s to a depth corresponding to the depth p.

According to the embodiment illustrated in FIGS. 1 and 2, the photodiode 1 comprises a contact recovery third region 23. The third region 23 is preferably of the first conductivity type, for example of the P type. Preferably, the third region 23 is located in the well 17 and is flush with the face 12s. The third region 23 has, for example, the shape of a round or oval ring, the shape of a square frame or a frame with rounded corners (squircle), similar to the shape of the trench 19 and is contained within the trench 19. The third region 21 is preferably closer to the trench 19 than the second region 21. The third region 23 preferably extends into the well 17 to a depth of between 200 nm and 800 nm, for example of the order of 500 nm.

According to the embodiment illustrated in FIGS. 1 and 2, the photodiode 1 comprises two electrodes 25 and 27.

The electrode 25, for example the cathode, is, for example, located opposite the second region 21. The electrode 25 is, for example, located on and in contact with a contact recovery fourth region 29 located in the second region 21 and flush with the face 12s. The electrode 25 has, for example, the shape of a parallelepiped, a cylinder, or a truncated cone. Alternatively, the electrode 25 has any shape that allows the second region 21 to be connected to overlying metal levels.

The electrode 27, for example the anode, is located opposite the third region 23, for example, located on and in contact therewith. The electrode 27 has, preferably, in plan view, a shape similar to the shape of the third region 23. If necessary, an intermediate region is provided between the electrode 27 and the region 23.

According to one embodiment, the substrate is made of silicon.

According to one embodiment, the layers of the first conductivity type, i.e., the buried first region 13, the substrate 11 and the third region 23 are doped with boron (B) atoms. According to one embodiment, the layers of the second conductivity type, i.e., the core 15 and the second region 21 are doped with arsenic (As) atoms.

According to one embodiment, the photodiode 1 is, when seen from above, inside a square with a side less than 7 μm.

FIGS. 3 to 9 represent cross-sectional views of the manufacturing steps of the photodiode of FIGS. 1 and 2.

FIG. 3 illustrates an initial structure from which photodiodes 1 as shown in FIGS. 1 and 2 are manufactured.

The substrate 11 is, as described in relation to FIGS. 1 and 2, gradually doped which reduces the phase jitter of the photodiode 1.

Figure 4:
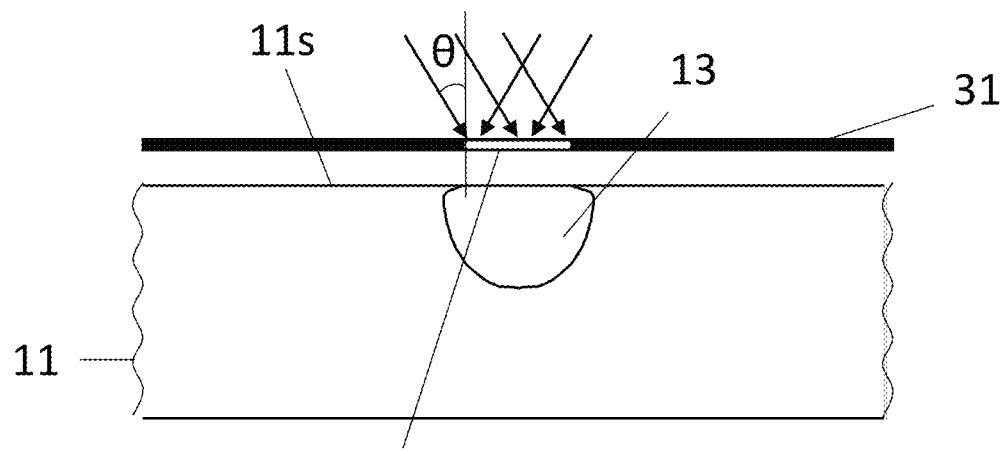
FIG. 4 represents a cross-sectional view of another step in the manufacture of the photodiode of FIGS. 1 and 2.

FIG. 4 illustrates a step for forming the buried first region 13 in the substrate 11.

According to this embodiment, the first region 13 is formed by implanting dopant atoms, for example boron atoms, into the substrate 11. The implantation of dopants illustrated in FIG. 4 is preferably performed through a mask 31 comprising an opening 32. The implantation of dopants illustrated in FIG. 4 is preferably performed from the upper face 11s of the substrate 11, with an oblique orientation.

According to one embodiment, the buried first region 13 is formed at an angle θ, calculated with respect to a direction normal to the face 11s, greater than 20°, for example, between 25° and 45°.

As an example, the oblique implantation of dopants in the buried first region 13 gives this buried first region 13 a shape corresponding to a truncated cone in the vicinity of the face 11s and substantially hemispherical in the depth of the substrate 11.

According to one embodiment, the buried first region 13 is formed by at least two successive implantations of dopants. By way of example, each of the implantations is formed at a different angle θ.

According to one embodiment, the buried first region 13 is formed by at least two successive implantations, for example four, six, or eight successive implantations. As an example, each of the implantations is formed at a different angle of rotation of the structure, with the axis of rotation being orthogonal to the upper face of the mask 31 (or the upper face 11s of the substrate) and passing through the center of the opening 32 of the mask 31 (or the center of the substrate 11).

According to one embodiment, the implantation energy of the dopant atoms is of the order of 40 KeV.

The implantation step is carried out on a full wafer in order to carry out a batch processing of all the structures that a single semiconductor wafer comprises.

Figure 5:
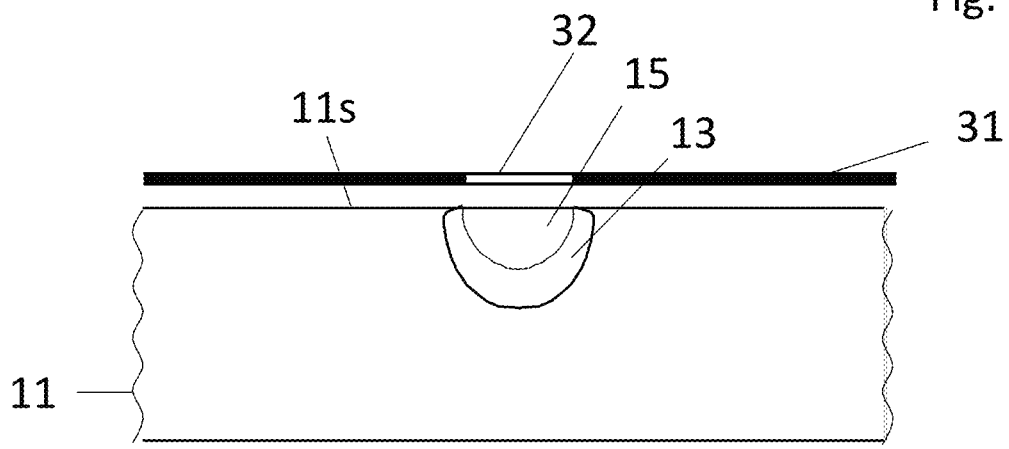
FIG. 5 represents, a cross-sectional view, of yet another manufacturing step of the photodiode of FIGS. 1 and 2.

FIG. 5 illustrates a step for forming the core 15 inside the buried first region 13. According to one embodiment, the core 15 is formed by implanting dopant atoms, for example, arsenic atoms into the buried first region 13. The implantation of dopants illustrated in FIG. 5 is preferably performed through the same mask 31 as that used during the implantation illustrated in FIG. 4. The implantation of dopants illustrated in FIG. 5 is performed, for example, with a non-oblique orientation, in a direction normal to the face 11s. The core 15 has a substantially hemispherical shape because the opening 32 of the mask 31 is narrow.

According to one embodiment, the implantation energy of the dopant atoms of core 15 is of the order of 10 KeV.

According to the embodiment illustrated in FIGS. 4 and 5, and more particularly the type of implantation of the buried first region 13, the base of the buried first region 13 has the shape of a circle or an ellipse.

According to one embodiment, the core 15 is formed prior to the formation of the buried first region 13 (i.e., the implantation of FIG. 5 is performed before the implantation of FIG. 4).

Figure 6:
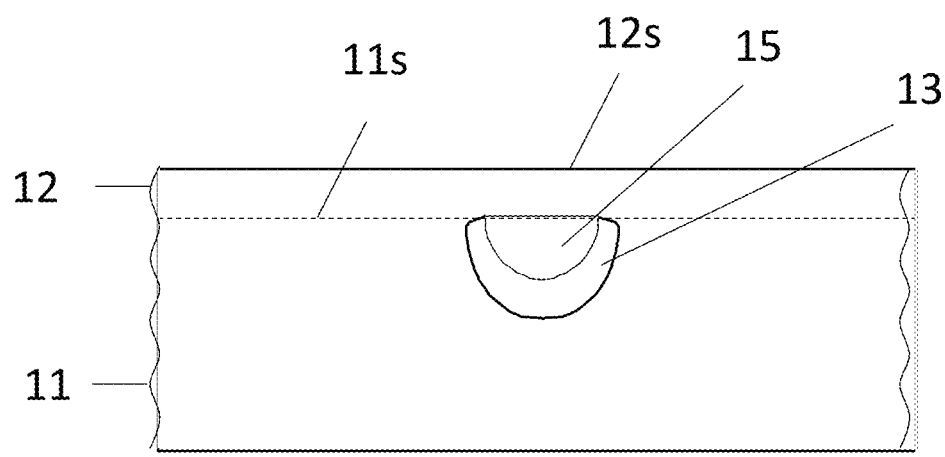
FIG. 6 represents, a cross-sectional view, of yet another manufacturing step of the photodiode of FIGS. 1 and 2.

FIG. 6 illustrates a step of epitaxial growth from the substrate 11 is performed so as to form the epitaxial layer 12.

According to the embodiment illustrated in FIG. 6, the substrate 11 is epitaxially grown. The epitaxial growth is performed full plate from the upper surface 11s. The epitaxial growth illustrated in FIG. 6 forms the epitaxial layer 12. The epitaxial layer 12 is located on and in contact with the face 11s. The epitaxial layer 12 includes face 12s, which is upper in the orientation shown in FIG. 6.

The epitaxial layer 12 preferably has a thickness between 200 nm and 800 nm, for example, of the order of 500 nm.

At the end of the step illustrated in FIG. 6, the PN junction, formed by the core 15 and the buried first region 13, is buried beneath the face 12s to a depth corresponding to the thickness of the epitaxial layer 12.

Figure 7:
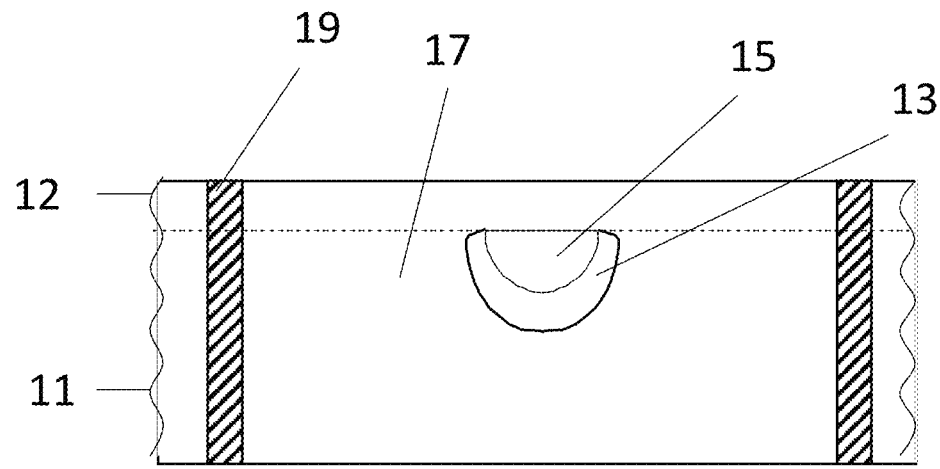
FIG. 7 represents, a cross-sectional view, of yet another manufacturing step of the photodiode of FIGS. 1 and 2.

FIG. 7 illustrates a step for forming the deep insulating trench 19.

According to one embodiment, the insulating trench 19 is formed by the succession of an etching step, a step of depositing an insulating coating layer on the walls of the opening thus made, and a step of filling the opening. The coating layer is preferably of an oxide, for example silicon oxide. The filling material is, for example, polycrystalline silicon.

According to one exemplary embodiment in which the trenches 19, created in the wafer, are through-going (i.e., passing completely through the thickness of the substrate 11), an adhesive wire transfer technique is used to hold the photodiodes singled out by the etching until the trenches 19 are filled.

According to another exemplary embodiment, the trenches 19 are formed so that they do not extend through the entire thickness of the wafer, with the substrate 11, after the trenches 19 are formed, a thinning operation at the rear face is performed so that the lower face of the trenches 19 is ultimately flush with the lower face of the substrate 11.

The substrate 11 and the epitaxial layer 12 form, within the trench 19, the well 17. The well 17 extends from the upper face 12s to the bottom of the substrate 11 shown in FIG. 7.

The substrate 11 then forms a guard ring around the PN junction.

Figure 8:
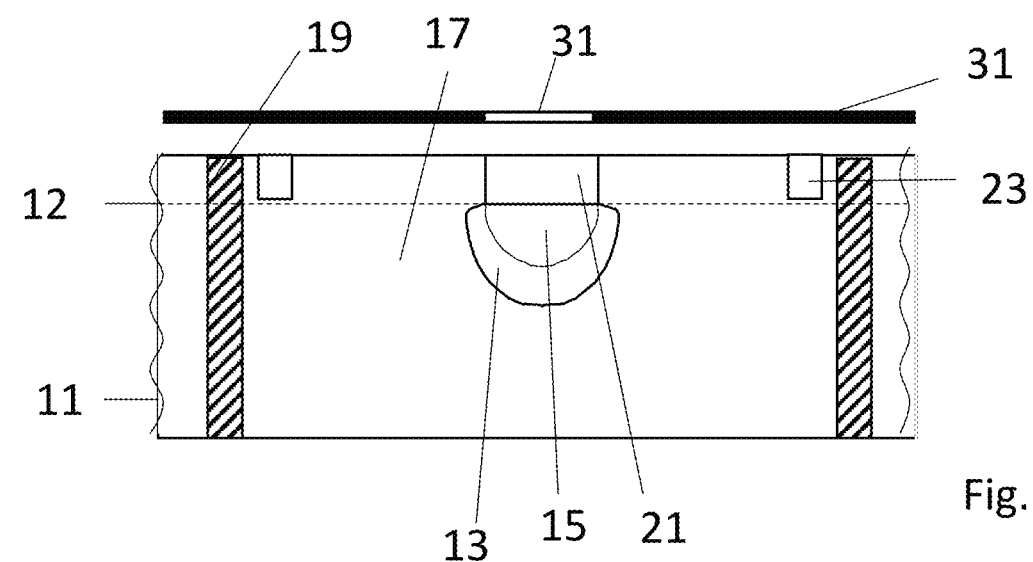
FIG. 8 represents, a cross-sectional view, of yet another manufacturing step of the photodiode of FIGS. 1 and 2.

FIG. 8 illustrates a step for forming the second region 21 and third region 23.

According to one embodiment, the second region 21 is formed by implanting dopant atoms, for example, arsenic atoms, into the epitaxial layer 12 opposite the core 15. The implantation, with a view to forming the second region 21, is preferably performed through the same mask 31 as that used during the implantations illustrated in FIGS. 4 and 5. The implantation is performed, for example, with a non-oblique orientation normal to the face 11s.

According to one embodiment, the third region 23 is formed by implanting dopant atoms, for example, boron atoms into the epitaxial layer 12. The implantation to form the third region 23, is performed, for example, with a non-oblique orientation, normal to the face 11s.

According to one embodiment, the implantation energy of the dopant atoms, in order to form the third region 23, is of the order of 60 KeV.

Figure 9:
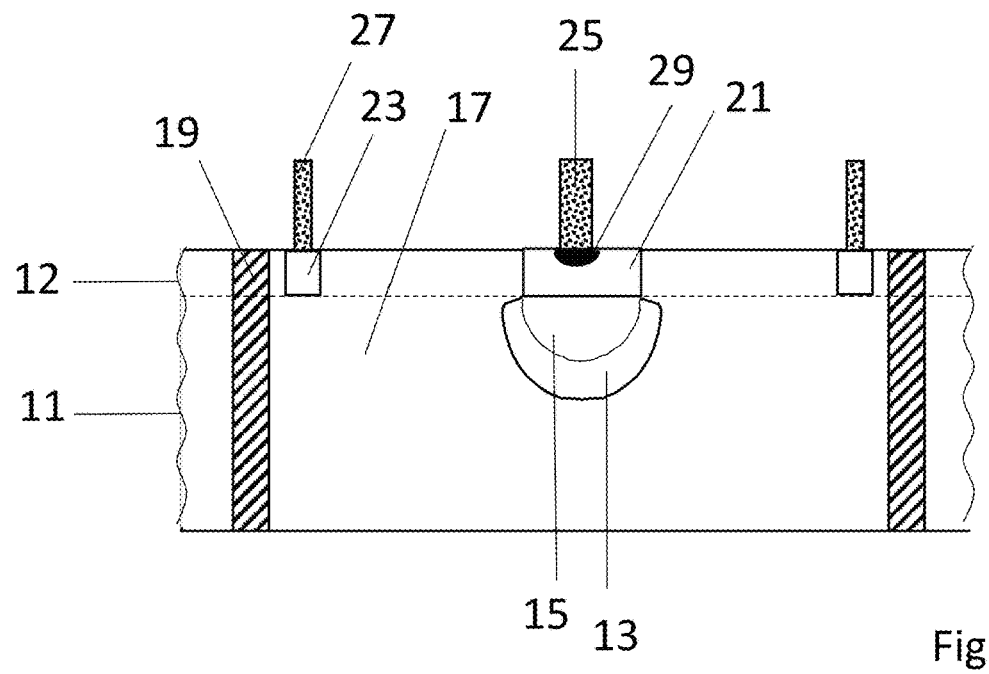
FIG. 9 represents, a cross-sectional view, of yet another manufacturing step of the photodiode of FIGS. 1 and 2.

FIG. 9 illustrates a step for forming the contact recovery region 29 and the electrodes 25 and 27.

The contact recovery region 29 and the electrodes 25 and 27 are formed by techniques customary in semiconductor device manufacturing in the microelectronics industry.

Figure 10:
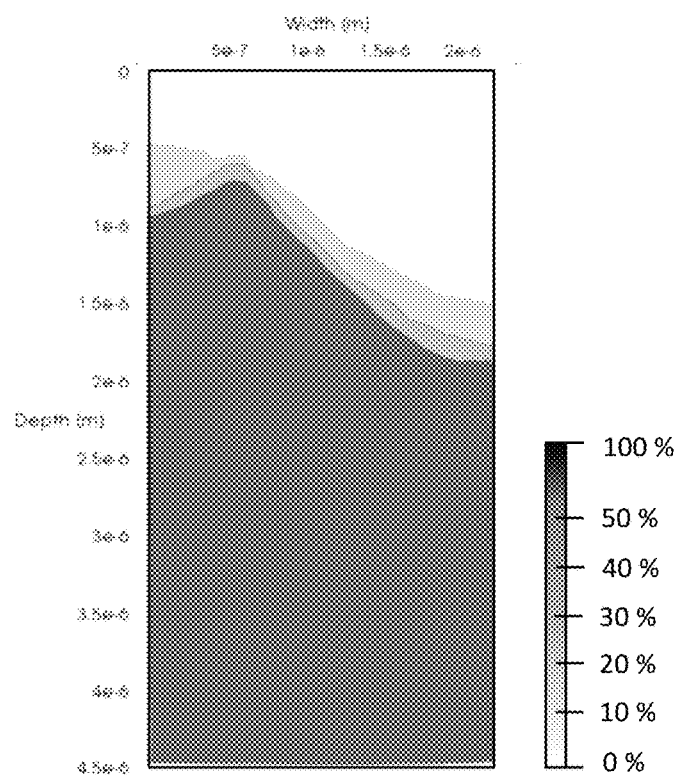
FIG. 10 is a graph illustrating the probability of a photon participating in an avalanche of the photodiode shown in FIGS. 1 and 2.

FIG. 10 is a graph illustrating the probability of a photon reaching the depletion region of the photodiode 1 illustrated in FIGS. 1 and 2.

Specifically, the graph illustrates the probability of a photon reaching the photodiode depletion region 1 as a function of its position in a cross-sectional plane orthogonal to the face 11s and passing through the center of the core 15. The graph illustrated in FIG. 10 has been realized when the voltage applied between the terminals 25 and 27 of the photodiode 1 corresponds to the avalanche voltage plus an excess voltage. The avalanche voltage is preferably around 17 V and the excess voltage is preferably around 4 V. Thus, the applied voltage is of the order of 21 V.

In the graph illustrated in FIG. 10, only half of the photodiode 1 in the plane illustrated in FIG. 9 has been represented, the photodiode 1 being, in this plane, symmetrical about a central axis.

The graph illustrated in FIG. 10 highlights the guard ring around the PN junction in which photons have only a very low probability (probability less than 10%) of participating in the avalanche of the photodiode 1.

It is also apparent from FIG. 10 that photons located in the structure at the PN junction have a high probability (probability greater than 50%) of participating in the avalanche of the photodiode 1. In addition, it is seen that photons located in the structure at the core have a low probability (probability between 10% and 40%) of participating in the avalanche of photodiode 1.

One advantage of providing a PN junction with an oblique implantation is that it maximizes the photosensitive volume and thus increases the fill factor and the photon detection probability (PDP). The oblique implantation also ensures a good collection of the photons through the whole volume. In addition, the low energy dopant implantation reduces noise and also reduces the size of the well and thus the size of the guard ring so that the diameter of the well is less than 4.48 µm.

Moreover, the fact that the PN junction is buried helps to reduce the Dark Count Rate (DCR) by avoiding the presence of a large electric field at the surface of the photodiode.

One advantage of the described embodiments and implementation methods is that they allow an avalanche voltage of the order of 20V.

Another advantage of the described embodiments and implementation methods is that they accommodate small photodiodes, for example, having sides less than 7 µm, for example less than 5 µm.

Yet another advantage of the described embodiments and implementation methods is that they overcome mask alignment issues for forming the core 15 and the buried first region 13.

In addition, gradual doping of the substrate participates in a reduction of the phase jitter of the photodiode.

Various embodiments and variants have been described. Those skilled in the art will understand that certain features of these embodiments can be combined and other variants will readily occur to those skilled in the art. In particular, the dopants, doping levels, thickness or height of the layers and regions may vary depending on the application.

Finally, the practical implementation of the embodiments and variants described herein is within the capabilities of those skilled in the art based on the functional description provided hereinabove.

The invention claimed is:

1. A method for manufacturing a photodiode, comprising:
   forming a first region of a first conductivity type having a substantially hemispherical shape in a semiconductor substrate of said first conductivity type;
   forming, within the first region, a substantially hemispherical core of a second conductivity type different from the first conductivity type;
   epitaxially growing an epitaxial semiconductor layer over the first region and the substantially hemispherical core; and
   forming a second region of the second conductivity type in the epitaxial semiconductor layer in a position that is aligned and in contact with the substantially hemispherical core.

2. The method according to claim 1, further comprising forming a peripheral insulating trench delimiting a well within which the substantially hemispherical core and the first region are located.

3. The method according to claim 1, wherein forming the first region comprises performing an oblique implantation of dopants of the first conductivity type, with respect to a direction normal to a top face of the semiconductor substrate, at an angle between 20° and 45°.

4. The method according to claim 3, wherein performing the oblique implantation comprises performing a succession of multiple oblique implantations of dopants at different angles of rotation of the semiconductor substrate.

5. The method according to claim 1, further comprising doping said semiconductor substrate to have a gradual doping increasing from the top face to a bottom face opposite the top face.

6. The method according to claim 1, further comprising forming a third region of the first conductivity type in said epitaxial layer, said third region annularly surrounding the second region.

7. The method according to claim 6, further comprising:
   forming a peripheral insulating trench delimiting a well within which the substantially hemispherical core and the first region are located;
   wherein said third region is positioned closer to the peripheral insulating trench than the second region.

8. The method according to claim 6, further comprising:
   forming a first electrode providing a cathode on and in contact with the second region; and
   forming a second electrode providing an anode on and in contact with the third region.

9. The method according to claim 1, wherein forming the first region and forming the substantially hemispherical core comprises performing dopant implantations through a same mask.

10. The method according to claim 1, wherein:
    forming the first region comprises performing an oblique implantation in the semiconductor substrate; and
    forming the substantially hemispherical core comprises performing a non-oblique implantation in the semiconductor substrate.

11. The method according to claim 10, wherein the oblique implantation is performed first and the non-oblique implantation is performed second.

12. The method according to claim 10, wherein the non-oblique implantation is performed first and the oblique implantation is performed second.

13. The method according to claim 10, wherein the oblique implantation and the non-oblique implantation are performed through a same mask opening.

14. The method according to claim 1, wherein the epitaxial semiconductor layer has a thickness of about 500 nm.

15. The method according to claim 1, wherein the substantially hemispherical core has a diameter, in a plane parallel to the top face of the semiconductor substrate, between 400 nm and 800 nm.

16. The method according to claim 1, wherein the first region having the substantially hemispherical shape and the substantially hemispherical core form a single photon avalanche diode (SPAD).

17. The method according to claim 1, wherein the substantially hemispherical core has a maximum height of about 500 nm.

18. The method according to claim 1, wherein the first region having the substantially hemispherical shape has a maximum height of about 1 µm.

19. A method for manufacturing a photodiode, comprising:
    forming, in a semiconductor substrate of a first conductivity type:
      a first substantially hemispherical buried region of the first conductivity type; and
      within the first substantially hemispherical buried region, a substantially hemispherical core of a second conductivity type, different from the first conductivity type;
    wherein: the first substantially hemispherical buried region is formed in the semiconductor substrate by an oblique implantation; and
    epitaxially growing the semiconductor substrate to bury the first substantially hemispherical buried region and form an epitaxial layer.

20. A method for manufacturing a photodiode, comprising:
- forming, in a semiconductor substrate of a first conductivity type:
  - a first substantially hemispherical buried region of the first conductivity type; and
  - within the first substantially hemispherical buried region, a substantially hemispherical core of a second conductivity type, different from the first conductivity type;
- wherein: the first substantially hemispherical buried region is formed under the substantially hemispherical core by an oblique implantation; and
- epitaxially growing the semiconductor substrate to bury the first substantially hemispherical buried region and form an epitaxial layer.

* * * * *